United States Patent [19]

Zeiner et al.

[11] Patent Number: 5,798,645
[45] Date of Patent: Aug. 25, 1998

[54] HARDWARE EMULATIONS SYSTEM WITH DELAY UNITS

[75] Inventors: Manfred Zeiner, Winzerstrasse 57, 1000 Berlin 20; Michael Budini, Leibnitzstrasse 28, 1000 Berlin 12, both of Germany

[73] Assignees: Manfred Zeiner; Michael Budini, both of Berlin, Germany

[21] Appl. No.: 384,391

[22] Filed: Feb. 3, 1995

Related U.S. Application Data

[63] Continuation of Ser. No. 38,359, Mar. 26, 1993, abandoned.

[30] Foreign Application Priority Data

Mar. 31, 1992 [DE] Germany .................. 42 11 162.5

[51] Int. Cl.$^6$ .................................................. G06F 13/00
[52] U.S. Cl. .................. 364/578; 364/580; 395/183.09; 395/800
[58] Field of Search .......................... 395/500, 800, 395/183.9; 314/578; 371/22.3; 364/578, 580

[56] References Cited

U.S. PATENT DOCUMENTS

| | | | |
|---|---|---|---|
| 4,725,975 | 2/1988 | Sasaki | 395/500 |
| 4,769,817 | 9/1988 | Krohn et al. | 395/183.09 |
| 4,787,061 | 11/1988 | Nei et al. | 395/500 |
| 4,907,180 | 3/1990 | Smith | 364/578 |
| 4,940,908 | 7/1990 | Tran | 307/443 |
| 4,954,953 | 9/1990 | Bush | 364/578 |
| 5,036,473 | 7/1991 | Butts et al. | 364/489 |
| 5,051,911 | 9/1991 | Kimura et al. | 364/468 |
| 5,058,001 | 10/1991 | Li | 364/578 |

(List continued on next page.)

FOREIGN PATENT DOCUMENTS 0 372 833 11/1989 European Pat. Off. ........ G06F 15/60

OTHER PUBLICATIONS

Tanenbaum; Structured Computer Organization; 1984; pp. 10, 11.

Daniel, Novel 4:1 Multiplexer Circuit For Gbit/s Data Rates; Electronic Letters Journal; Jul. 5, 1909; pp. 1092–1093.

IBM Technical Disclosure Bulletin; Compensation for Variation in Circuit Delay; vol. 28, No. 12; May 1986; pp. 5180–5182.

Vogelsong et al; Automated Synthesis of Macro/Behavioral Models For Mixed Analog/Digital Circuits, Including Complete Power. Supply Effects; Jun. 14, 1991; 9th Biennial University/Govern./Industry Microelectronics Symposium; pp. 173–178.

*Primary Examiner*—Parshotam S. Lall
*Assistant Examiner*—Saleh Najjar
*Attorney, Agent, or Firm*—McGlew and Tuttle

[57] ABSTRACT

The invention relates to an electronic hardware ASIC (Application Specific Integrated Circuit) prototyper permitting the emulation of integrated circuits or ASICs, so that testing of the component to be generated is possible in the later hardware environment.

There are known in the art emulation systems comprising a matrix of configurable logic blocks, configurable 10 cells and a configurable wiring. These systems emulate the functional behavior only of the desired circuit.

According to the invention, by the addition of programmable delay units into the logic cells, and by the application of programmable coupling fields with delay units to combine the logic modules formed of a multitude of logic cells, it is achieved that the time behavior of an ASIC is considered during emulation, so that a complete emulation is obtained. By purposely setting all inputs to a defined logic state, a fault emulation can be achieved. By the programmable delay units, race problems can be detected.

26 Claims, 7 Drawing Sheets

U.S. PATENT DOCUMENTS

| | | | |
|---|---|---|---|
| 5,109,353 | 4/1992 | Sample et al. | 364/578 |
| 5,210,700 | 5/1993 | Tom | 364/489 |
| 5,239,213 | 8/1993 | Norman et al. | 307/465 |
| 5,260,881 | 11/1993 | Agrawal et al. | 364/489 |
| 5,263,149 | 11/1993 | Winlow | 395/500 |
| 5,274,568 | 12/1993 | Blinne et al. | 364/489 |
| 5,293,327 | 3/1994 | Ikeda et al. | 364/578 |
| 5,305,229 | 4/1994 | Dhar | 364/489 |
| 5,317,698 | 5/1994 | Chan | 395/325 |
| 5,345,401 | 9/1994 | Tani | 364/578 |
| 5,359,534 | 10/1994 | Fujiki et al. | 364/489 |
| 5,359,535 | 10/1994 | Djaja et al. | 364/489 |
| 5,363,319 | 11/1994 | Okuda | 364/578 |
| 5,408,637 | 4/1995 | Shimizu | 364/578 |
| 5,418,931 | 5/1995 | Moorby | 395/500 |
| 5,440,721 | 8/1995 | Morgan et al. | 395/550 |
| 5,477,475 | 12/1995 | Sample et al. | 364/578 |
| 5,502,729 | 3/1996 | Nakata | 371/22.3 |
| 5,590,349 | 12/1996 | Robinson et al. | 395/800 |

FIG. 1a
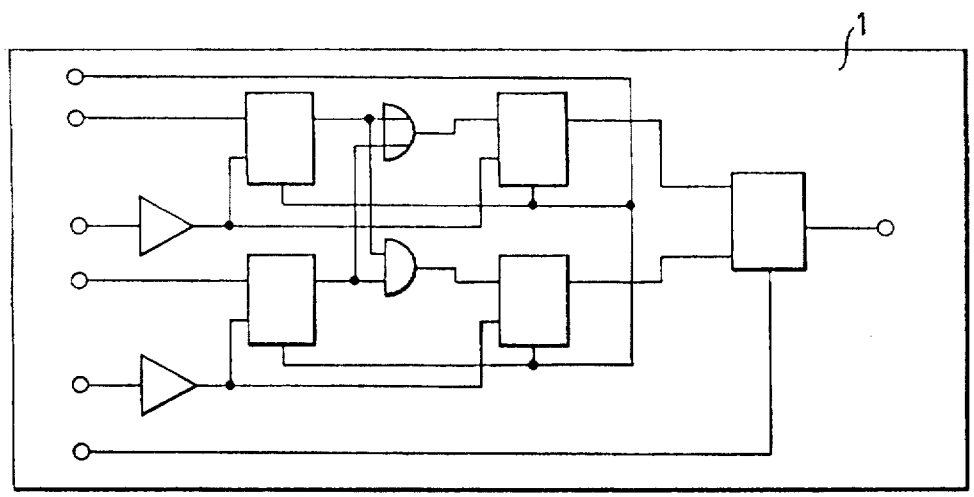
FIG. 1b    FIG. 1c    FIG. 1d
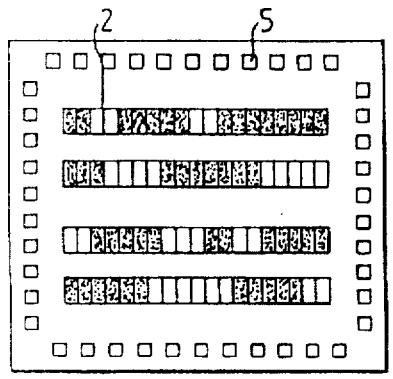
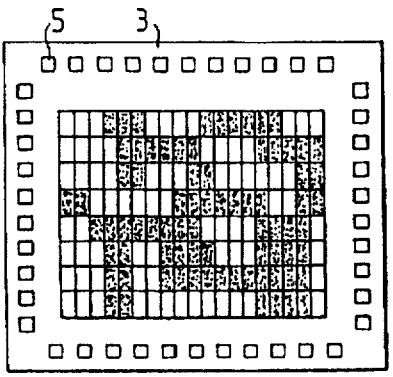
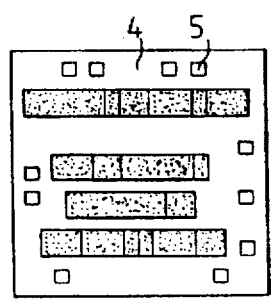
Gate-Array    Sea-of-gates    Cell-Array

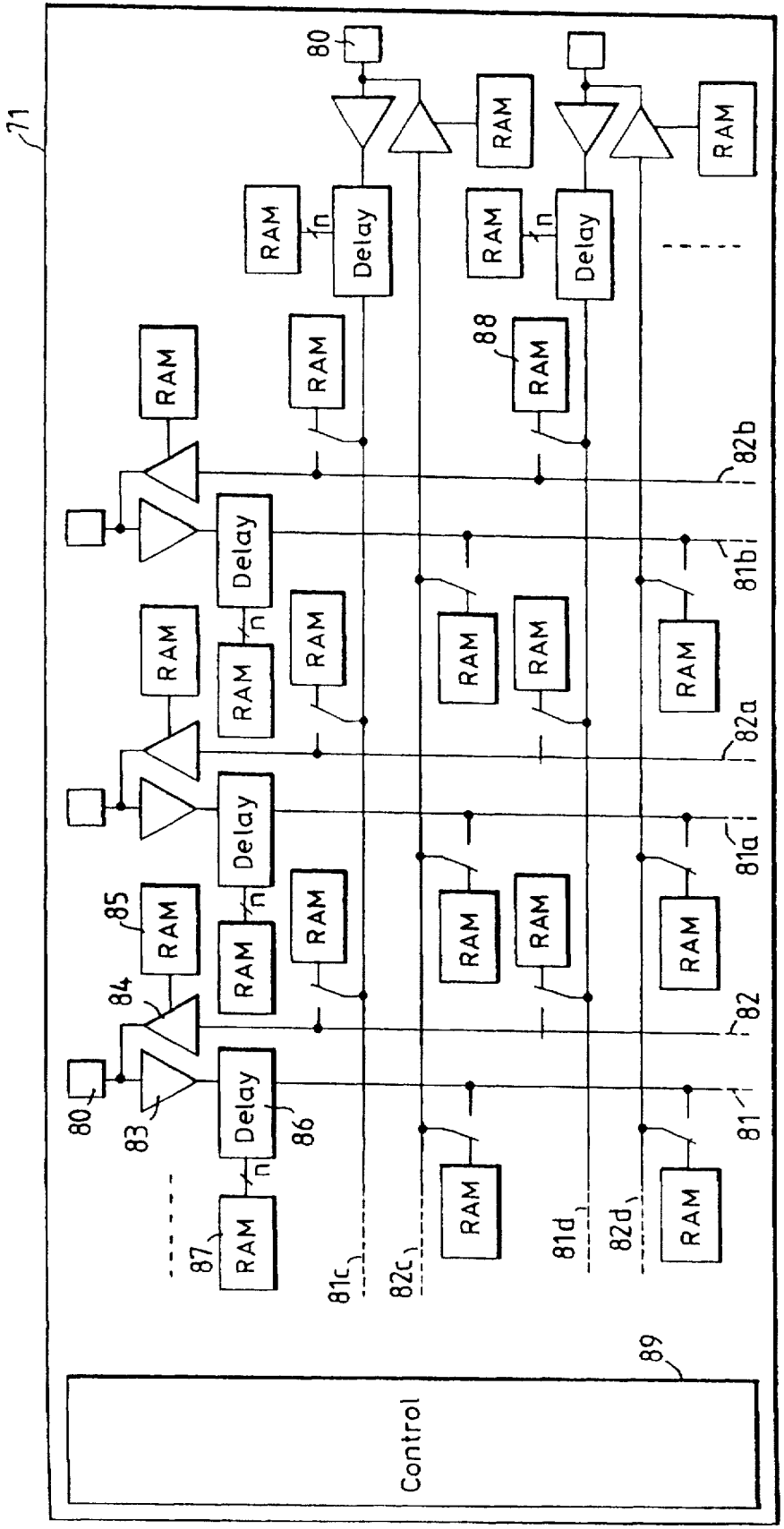

HARDWARE EMULATIONS SYSTEM WITH DELAY UNITS

This is a file wrapper continuation application of application Ser. No. 08/038,359 filed Mar. 26, 1993, now abandoned.

FIELD OF THE INVENTION

The invention relates to an electronic hardware ASIC (Application Specific Integrated Circuit) prototyper permitting the emulation of integrated circuits or ASICs, so that testing of the component to be generated is possible in the later hardware environment.

BACKGROUND OF THE INVENTION

CMOS technology allows electronic design engineers to implement complete systems in digital technique on an integrated circuit. The development of a complex circuit is supported by a multitude of automatic methods, which can be employed rather safely, provided that the necessary rules are observed. At the beginning of a development process, the specification of the component to be provided is set up. Herein, the exact function is described and laid down, with the logic behavior and the necessary mechanical, physical and electrical boundary conditions. If a complete development of an integrated circuit is not intended, then the aim is an ASIC exactly corresponding, in the device environment, to the desired specification. For applications involving larger quantities, the mask-programmable ASIC technologies are at present the most economic solutions for meeting most specifications. ASICs in the form of a gate array, a sea-of-gate ASIC or a cell array are employed. The three types differ by the geometrical arrangement of their internal logic blocks, which can freely be interconnected. The development or design of the ASICs is achieved by careful simulation prior to the costly manufacture. Simulation means the execution of an algorithm describing, as a model, the behavior of the desired circuit. This offers the possibility to analyze and verify a design, without building a hardware equivalent. As an interface between the user and the manufacturer of the ASIC serves a netlist, by means of which the function of the circuit is uniquely defined by a connection list of library elements of the selected manufacturer. The individual library elements describe simple and complex basic circuits and logic operations. Generating a connection list can be achieved in two ways, either by entering the circuit diagram or by entering a description of behavior, e.g. by a truth table, with a subsequent synthesis of the circuit. Further, both methods can be mixed. Checks of the netlist are performed by means of simulators. Software models are assigned to the library elements, such models being intended to simulate the later behavior as accurately as possible. Thereby, a software model of the complete circuit is available beforehand, taking into consideration, however, that the model may always be affected by faults. The reaction of this model is investigated by applying stimulus patterns by means of a logic simulator. A stimulus pattern means, herein, that the inputs of the model are exposed to input data. The simulator calculates the output data. The events are compared to the planned values. This will lead, however, only then to a safe success, if the stimuli correspond to the actual conditions and if the checked reactions also have the desired results. The risk of a faulty specification of the simulated circuit cannot fully be excluded, in this method. Further, the simulation sequences are generally slow and require long calculation times and capacities, so that the method is also costly. Such a simulation does not take into account, in what kind of physical environment the circuit is employed, i.e. the conditions of the hardware environment, where the circuit is intended to be used, are not considered.

It is also possible, in a software model, to simulate the environment of the projected circuit or of the ASIC, resp., and to include it in the simulation. This is, however, possible to a limited extent only, since the environment has to be open to a model for the simulator. Since the complete system is, in most cases, not closed, a model for the complete system is not possible. Thereby, interfaces have to be defined for the complete model, in order to achieve a limitation of the complete system. Interfaces again may lead to specification faults, and the problem is at best shifted to somewhere else. An extension of the simulation by the limited complete system leads to another increase of the simulation calculation times, without faults being safely excluded.

Another possibility for including the environment is using a "hardware modeler". Herewith, the hardware environment or parts thereof are linked to the software simulator, over interface circuits. They are called by the simulator like software macros. The necessary interface circuits have, however, to be individually established for each hardware unit, since the much faster hardware has to be adapted to the much slower software, by temporary storage of all occurring states. This approach theoretically solves the problem of the specification of interfaces between the ASIC software model and the hardware environment; practically, however, it cannot be executed due to the considerable adaption tasks, which may even cause faults, and it is expensive. In practical applications, therefore, only standard elements, for which software models are too complex, such as processors, controllers or the like, are included in the simulation over a "hardware modeler".

A very effective method for testing the functionality of a circuit in its environment is not the simulation with software models, but the hardware simulation, i.e. the individual sub-elements of the ASIC are replaced by hardware models. This is called an emulation. There is known in the art the "RPM (Rapid Prototype Machine) Emulation System", the mode of operation of which has been described in EP-OS 0 372 833. The system relies on logic cell arrays (LCA) as a hardware base, such as offered, e.g., by XILINX Inc. These are components composed of a matrix of configurable logic blocks, configurable I/O cells, and of a configurable wiring. Configurability is achieved by memory cells, which are part of the LCA, as a memory. For emulation, the netlist simulated by the software of the projected ASIC is correspondingly translated, transferred into an arrangement of LCAs, and is represented therein as a hardware configuration. The inputs and outputs of the emulator (LCA arrangement) now correspond to the terminals of the emulated ASIC, and are directly included, over adapters, in the surrounding circuit of the ASIC. The function of the emulated circuit can, therefore, be directly tested in the intended environment.

It is disadvantageous, for this approach of emulation of the ASIC by means of LACs or other FPGAs (field programmable gate arrays), that modelling of the ASIC elements can only be made functionally, i.e. in the logic sequence, not, however, in its time behavior. The signal propagation times and their relationships are not considered, and cannot be checked, in the prior art emulation system. In the worst case, manual operations in the wiring strategy of the LCA have to be performed, in the prior art emulation system, in order to establish the functionality of the emulated circuit. Consequently, complete checking and complete testing of the projected ASIC are only possible within limits, by the prior art system, since the time behavior is not taken into consideration. Risks of cost-intensive redesigns cannot be excluded. Another substantial disadvantage with prior art emulators with LCAs results from the fact that the internal states of the represented nodes of the circuit can only be achieved by prior explicit wiring at a pin of the LCA. In other words, the states at the nodes of the circuit cannot be observed or modified. During necessary debugging, this circumstance is extremely disadvantageous, since for checking a node not being wired towards outside, a new representation of the complete ASIC netlist has to be made, with all the difficulties and risks.

SUMMARY AND OBJECTS OF THE INVENTION

It is therefore the object of the invention to provide a system for the emulation of electronic hardware systems, which permits a complete emulation under consideration of the time behavior of the circuit to be designed.

According to the invention, a hardware emulation system is provided for emulating electronic hardware systems. The emulation system includes a multiplicity of configurable logic cells connected with each other to form logic blocks, of configurable input output (I/O) cells and of configurable wiring. In each logic cell, programmable delay units are inserted. By adding free-programmable delay elements into the logic cells, it is now possible to also take into account, in the emulation, the time behavior of the circuit to be designed. Thereby, a complete test of an ASIC by emulation is possible.

For each input and output signal unit of a logic cell or of an FPE (field programmable emulation) cell, a programmable delay element is present, in order to individually adjust each line to its time behavior. The input signals of the assembly to be emulated are available at the wiring bus of the logic cell consisting of N lines, on one of the lines. Over the input multiplexer of each input connecting-through over a RAM control circuit to the correct bus line, the input signal is coupled into that logic cell, where the logic operation is intended to take place. By a suitable fine gradation of the delay element, the input signal can variably be delayed. The multiplexer provided at the end of each input signal line connects, depending on a control signal coming from the respective RAM memory, either the input signal or a fixed logic state through to the selectable logic function unit. This input has a connection towards the outside, and can, thus, be interrogated for its logic state. The N inputs are fed to a free-configurable logic function unit. The logic function unit is connected with a RAM, so that thereby, various basic logic functions, such as AND, NAND, OR, NOR, XOR, XNOR etc. and latch functions can be adjusted. In this way, elements of a netlist can be represented in a relatively simple manner during the ASIC emulation. The output of the logic function unit is connected with a multiplexer, the control line of which is connected with a RAM. It is possible thereby, to connect either the output signal of the logic function unit or an input, under by-passing the logic unit, through to the output. This arrangement offers the possibility to operate the controlled FPE cell not as a logic element with the pertinent delays, but to use the FPE cell as an additional wiring possibility without switching or other delays. The output of the output multiplexer can, same as for the aforementioned inputs of the logic function unit, be interrogated from outside over a readout circuit. It is possible, thereby, to determine at any time the state of any desired node or wiring element of a represented circuit by simple interrogation. The output line of a logic cell is, further, provided with a fine-graded delay element, so that the time behavior of the logic elements and of the wiring portions can be represented. The output of the complete FPE cell is supplied, over an n-stage demultiplexer, to the wiring bus, and then to the inputs of the other FPE cells. The width of the wiring bus depends on the topology of the complete FPE arrangement, i.e. of an FPE module.

If a sufficiently large number of FPE cells and a sufficiently wide wiring bus are available, each circuit, which can be represented by a free-programmable logic function, can also be represented with all delay times, and can thus be emulated. Simultaneously, all nodes of the circuit can be interrogated for their logic states in operation. Further, the arrangement according to the invention permits that each input of an employed logic element can be set to a defined state.

In order to achieve as high frequencies as possible of the circuit emulated with this arrangement, as many FPE cells as possible have to be combined on the smallest space. This can be achieved, to a certain extent, with today's integration techniques. Since, with increasing integration density, the yield of functioning FPE cells on a carrier reduces, one is forced to split the totality of all FPE cells up into modules. Several modules are combined and form a so-called ASIC box. In the ASIC box, several FPE modules are combined with each other either by direct wiring or over free-programmable coupling fields. According to the invention, the signal lines of the free-programmable coupling fields are also provided with adjustable delay elements, so that wiring of any desired FPE modules is possible, under the modelling possibility of the propagation times of a connection. This is easier than to simulate the propagation times of, e.g., bus connections etc. over the delay adjustments of the internal wiring of the FPE cells. Programming of the delay elements of the coupling fields is also performed over RAMs, same as for the internal delay elements of the internal FPE cells. The intersections of the signal lines of the coupling fields again are programmable over RAMs, i.e. a connection can be connected through or not.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1a is a circuit diagram of an arbitrary circuit which may be intended to be implemented in an ASIC;

FIG. 1b is a gate array as one possibility for an ASIC;

FIG. 1c shows a sea of gates as another possibility of an ASIC;

FIG. 1d shows a cell array as still another possibility of an ASIC;

FIG. 7 is a block diagram of a coupling field according to the invention.

DETAILED DESCRIPTION OF THE PREFERRED EMBODIMENT

Referring now to FIG. 1, there is shown, in the upper half, an arbitrary circuit diagram. This example of a circuit concept is intended to be implemented in an ASIC. As ASICs, gate arrays 2, sea of gates 3 or cell arrays 4 are considered, all of which are digital mask-programmable ASICs.

Figure 2:
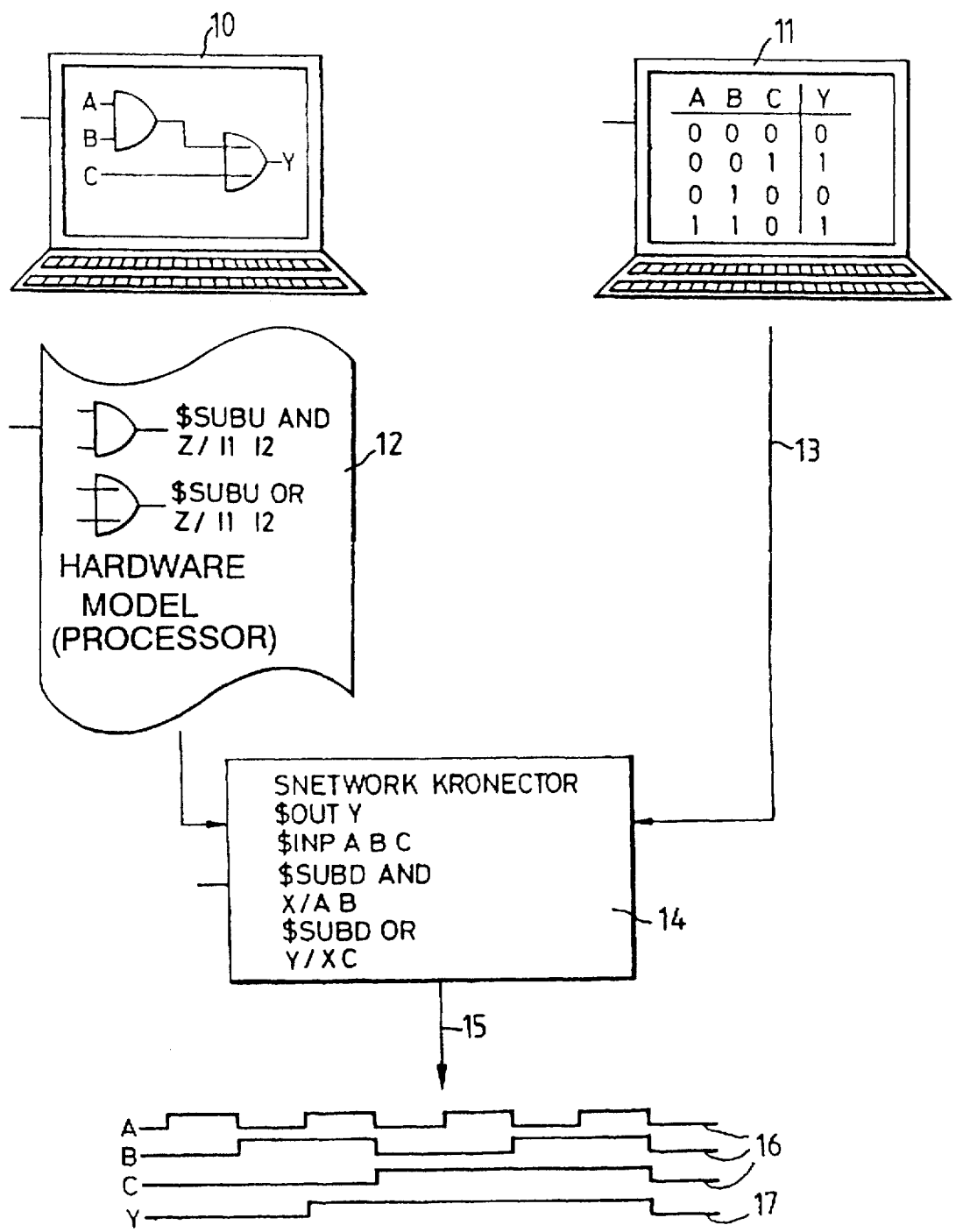
FIG. 2 is a diagrammatic representation of sequences of the circuit emulation.

FIG. 2 shows the usual sequences of a circuit design up to the software simulation of the projected circuit. At the beginning of a design, the circuit diagram is established. The latter is entered over an entry 10 of a circuit diagram into a computer. Therein, the circuit diagram is transformed into a netlist, by means of library elements 12 offered by the ASIC manufacturer. The library elements 12 describe basic logic functions or the like. As part of the software, models are assigned to said library elements, the models describing as accurately as possible the later behavior. Thus, a simulation 15 of the desired circuit follows. This simulation will also be obtained in a second way, by entering a description of behavior 11 into the computer system. Together with a logic synthesis 13, a netlist 14 is established. Starting from the netlist, a simulation model 15 is created. By means of a stimulus pattern 16, the inputs of the software model are occupied with data. The simulation will then lead to a simulation result 17, which can be compared to the desired data.

Figure 3:
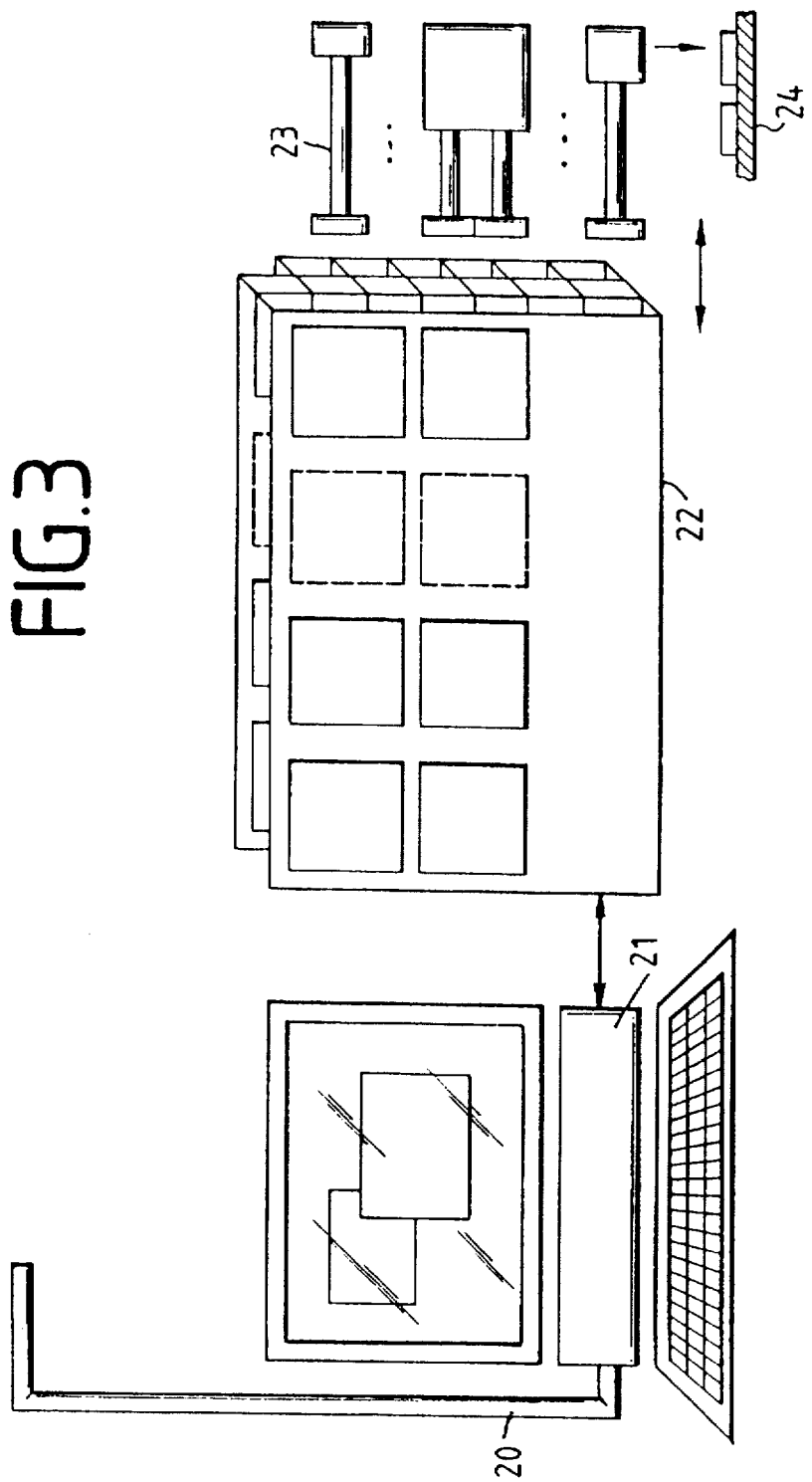
FIG. 3 is a schematic representation of a hardware emulation.

FIG. 3 shows the schematic representation of an ASIC emulator. By a data transmission 20, the netlist, the required library and the desired pin configuration of the ASIC are entered into a data processing installation 21. The data processing installation 21 executes the administration of the man-machine interface, establishes the placing and wiring data for the emulator 22, according to the respective prescription, and physically transfers the placing and wiring data into the emulator 22, so that therein, a hardware representation of the desired circuit is present. The emulator 22 reacts, consequently, like the projected or proposed ASIC, so that thereby tests for functionality etc. can be performed. The emulator is provided with a PIN adapter unit 23, i.e. can be placed in the hardware environment, into which the ASIC is intended to be inserted.

Figure 4:
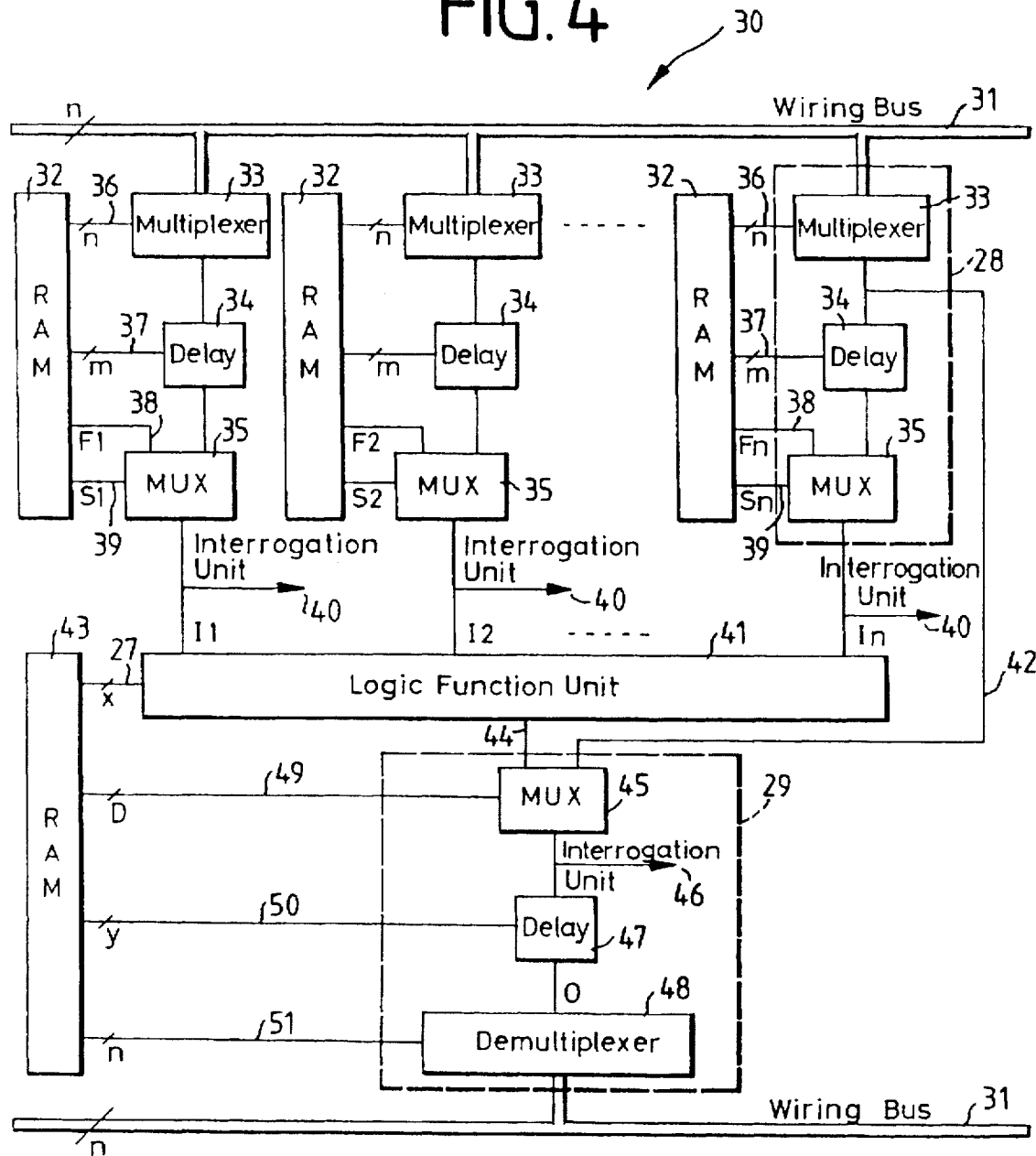
FIG. 4 is a block diagram of an FPE cell according to the invention.

FIG. 4 shows the block diagram of a logic cell 30 of the FPE—(Field Programmable Emulation), i.e. an FPE cell. An FPE cell 30 includes terminals for the wiring bus 31, consisting of n lines. The number n depends on the application and is greater than or equal to 1. Over a first multiplexer 33, the input signals are connected to the respective input unit or means 28. There are n input units 28. An input unit 28 comprises the aforementioned multiplexer 33, a subsequent input delay unit or means 34 and or second another multiplexer 35, the elements of the input unit 28 being controlled by an input RAM means 32. n control lines 36 lead to the multiplexer 33, m control lines 37 control the time resolution of the delay unit 34, and a select line 39 connects a bit of the RAM 32 with the second multiplexer 35. Further, the output of the delay unit 34 and a signal line 38 of the RAM 32 form the inputs of the multiplexer 35. It is achieved, thereby, that depending on the condition of the select line 39, the logic function unit 41 is either provided with the input signal coming from the wiring bus 31, or with a fixed signal coming from the RAM 32. Between the multiplexers 35 and the logic function unit 41, there is provided an interrogation unit or means 40, so that the logic condition of the logic function unit 41 can be checked. The n outputs of the input units 28 are supplied to the logic function unit 41. Therein, depending on the output RAM means 43, the basic logic functions, latches etc. are adjusted. The result of the logic operation is fed, over an output 44, to a multiplexer 45 of the output unit 29. The output unit 29 comprises the elements multiplexer 45, interrogation unit 46, output delay unit or means 47 and demultiplexer 48. The logic function unit 41 and the elements of the output unit 29, except for the interrogation unit 46, are supplied with data or are controlled by the RAM 43. For this purpose, control lines 27, 49, 50 and 51 are provided, corresponding to FIG. 4. The output 44 of the logic function unit 41 and the bridging line 42 form the two inputs of the multiplexer 45. The bridging line 42 directly connects an input unit 28 with the output unit 29, by-passing the logic function unit 41, tapping of the bridging line 42 taking place directly behind the multiplexer 33. Depending on the control of the multiplexer 45 by the control line 49, either the output signal of the logic function unit 41 is connected through, or the non-delayed, unchanged input signal. This opens up the possibility to use an FPE cell as a pure line. By means of the interrogation unit 46, the output of the logic cell 30 can be checked. Further, at the output of the multiplexer 45, there is connected a controllable delay unit 47 having y control lines 50. Thereby, the time behavior of the logic outputs and of wiring portions can fine-gradedly be represented during an emulation. The output 0 of the delay unit 47 is supplied over the n-stage demultiplexer 48 connected over n control lines 51 to the wiring bus 31, in order to be selectively fed to one of the n lines of the wiring bus 31 and thus to the inputs of the other FPE cells. The width n of the wiring bus 31 depends on the topology of the complete FPE cell arrangement.

Figure 5:
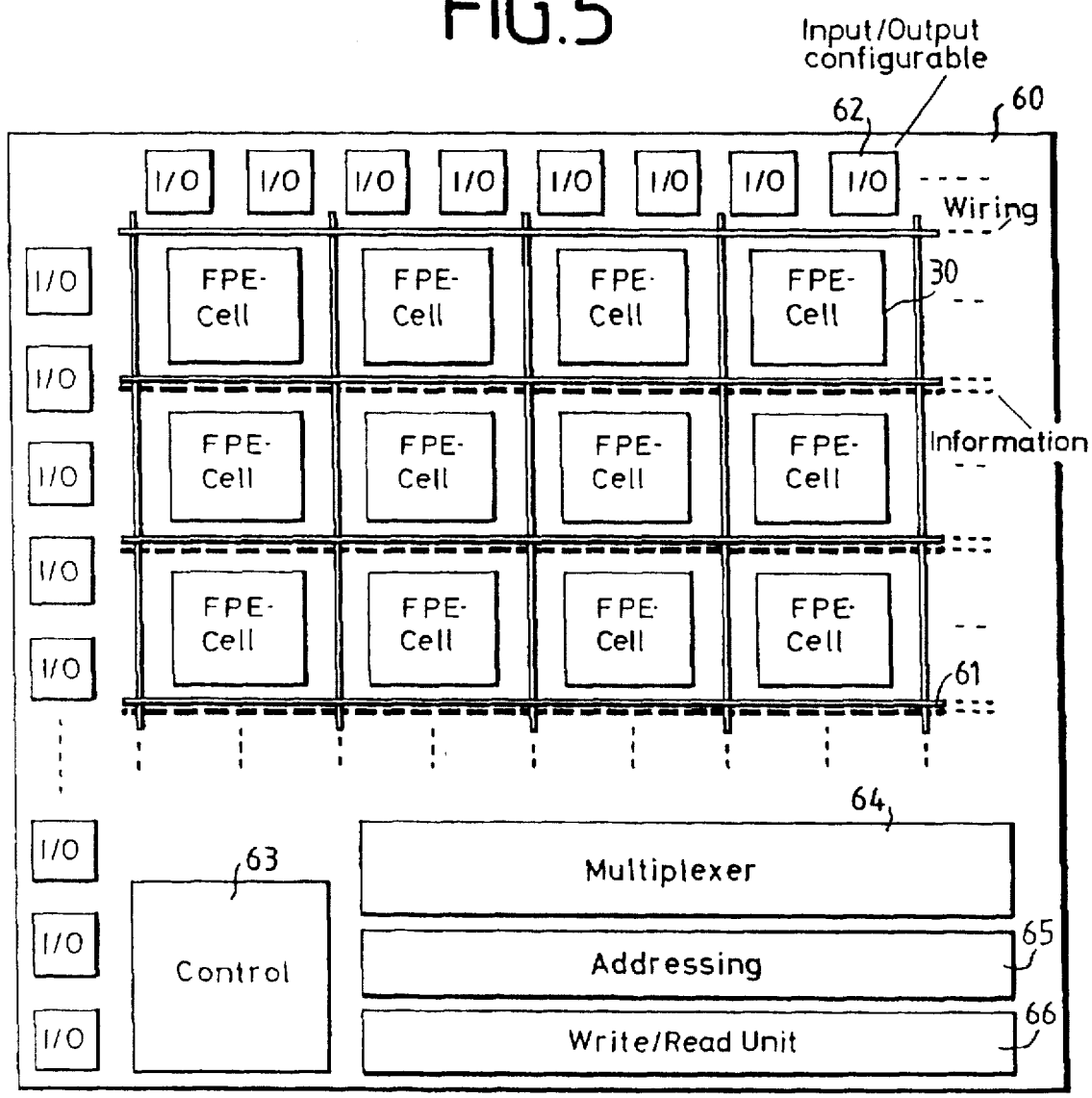
FIG. 5 is a representation of the construction of an FPE module according to the invention.

FIG. 5 shows the combination of a multitude or multiplicity of FPE cells to an FPE module 60. The FPE module 60 comprises FPE cells 30 disposed on a carrier in a matrix form. The individual cells 30 are connected with each other by a wiring bus 61. Further, an FPE module comprises a multitude of I/O units 62. These I/O units are configurable. In the chip "FPE module", there are, in addition, a controller 63, a multiplexer for interrogation of the cell status 64, an addressing 65 of the multiplexers for interrogation of information of the FPE cells and RAMs of the logic cells, and a write/read unit 66.

Figure 6:
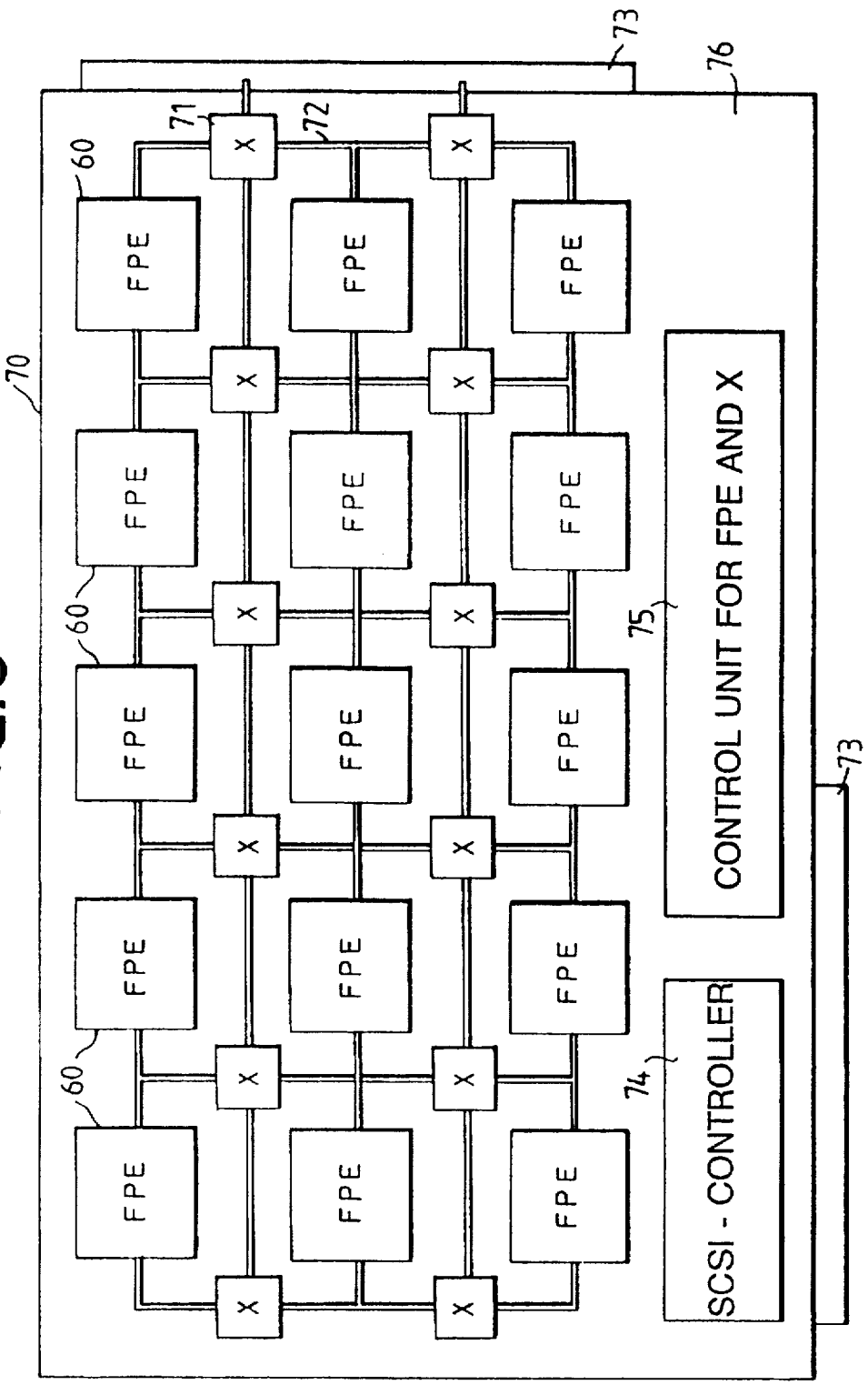
FIG. 6 is a block diagram showing the systematic construction of an ASIC box.

In FIG. 6, the system construction of an "ASIC box" 70 is represented. A multitude of FPE modules 60 are applied in a matrix form in, e.g., a board 76. The individual FPE modules are connected with each other over coupling fields 71 and the necessary connections 72 such that each logic cell can finally be connected with any other desired one. Further, a control unit 75 is required for controlling the FPE modules 60 and the configurable coupling fields 71 in the ASIC box 70. For terminating the ASIC box 70 to a data processing installation serves an SCSI interface 74.

FIG. 7 shows a schematic circuit diagram of the configurable coupling fields 71. Each terminal point 80 of a coupling field 71 is split up into two opposed signal lines 81 and 82, the signal directions of which are determined by the direction-depending input and output amplifiers 83 and 84, the output amplifiers 84 being controlled by a RAM 85 into the driven state or into the high-impedance state. Each signal line 81 comprises a delay unit 86 controlled over a RAM 87. Further, each intersection of a signal line with a corresponding other one of the correct direction is programmable by means of a RAM 88, so that either a connection of the intersections is established or not.

The following applications are possible for the aforementioned hardware arrangement, the "ASIC prototyper". Networks of ASICs or other logic circuits can be formed on the prototyper, the logic and the time behavior of the logic elements and the connections thereof being capable to be modelled among each other. The variability is achieved by the software adjustment of the RAM structure. Thereby it is possible to emulate the function of an ASIC prior to its accomplishment, and to test it in the adequate environment. The built-in capability to interrogate the logic states of any desired nodes, considerably facilitates fault tracing, when the functionality of the emulated circuit is not met in its environment.

Further, the ASIC prototyper can be used for fault simulation. When manufacturing ASICs, there are principal defects, which can be detected in a subsequent test. Since it is not possible to measure within an IC, it has to be provided for that all internal nodes are controllable and checkable. Further, a test pattern is required, detecting all possible fault sources. For this purpose, there is provided a fault model covering nearly all faults. This is the "stuck at 1 and stuck at 0" approach. The base is to force each internal node to logic 1 and then to logic 0. By the response at the output of the IC, it is determined, now, whether this fault operation is detected or not. Up to now, such analyses are performed at software representations by means of a fault simulator. Since each fault means a complete simulation sequence, the execution times for large ASICs and long test patterns are extremely long, even with the fastest computers, and are in the order of days. Therefore, it is tried to reduce the times by a statistical fault simulation, by a statistical selection of the nodes. An exact statement with regard to the actual fault covering is not possible, however. By the capability of the prototyper according to the invention to set all nodes to any desired state, a "fault emulation", instead of a fault simulation, can be achieved with considerably less expenditure of time, and yields an exact statement with regard to the behavior of the planned ASIC in case of manufacturing faults. From the behavior of the prototyper in case of a fault, a modification of the circuit itself or an extension of the test pattern can easily be derived, which leads to safe testing after manufacture.

Further, it may happen when designing circuits that at a logic element having several inputs, two signals change their states at approximately the same time. This has fatal consequences for the clock/data relationship of a flipflop, since then different data are processed. Such races are definitely to be prevented, therefore. In the same way, there are "skew" problems. Here, many flipflops are connected to a common clock. With very fast semiconductor technologies, the switching time of a flipflop is in the same order as the propagation time on the clock line. Thereby, a "race" problem is caused. Unfortunately, no tools are known in the art to sufficiently solve such problems. With the variable delay units of the prototyper according to the invention at each node and in the connection lines, a "race" condition now can easily be detected, when the circuit leads, after a variation of the delay times in positive or negative directions within given limits, to a different behavior. This approach leads to a reliable statement with regard to the "race" and "skew" behavior of the designed ASIC.

While a specific embodiment of the invention has been shown and described in detail to illustrate the application of the principles of the invention, it will be understood that the invention may be embodied otherwise without departing from such principles.

What is claimed is:

1. A hardware emulation system for emulating a hardware portion of an electronic apparatus, the system comprising:
   a wiring bus containing a plurality of lines;
   a multiplicity of configurable logic cells, said logic cells being connected with each other through said wiring bus to form logic blocks of configurable input/output cells and a configurable wiring arrangement, each of said multiplicity of configurable logic cells including an output unit, and each output unit including a programmable delay means for individually delaying an output of a respective said output unit for a programmable amount of time, said delay means delays an output signal of said output unit to represent time behavior of a respective said logic cell and wiring portions of the apparatus which is emulated, an interrogation means in each output unit for reporting a type of data in said logic cell and a demultiplexer means connected to said delay means and said wiring bus for selectively placing said output of said output unit onto one of said plurality of lines of said wiring bus.

2. A hardware emulation system according to claim 1, wherein:
   each of said logic cells includes a plurality of input units with a programmable delay means inserted in each of said plurality of input units and for delaying an input of said logic cell for a programmable amount of time.

3. A hardware emulation system according to claim 2, wherein:
   said each of said plurality of said input units of each of said logic cells includes an interrogation unit for checking the logical status of a corresponding one of said logic cells.

4. A hardware emulation system according to claim 1, wherein:
   said interrogation means determines a logic condition at the output of a corresponding one of said logic cells.

5. A hardware emulation system in accordance with claim 1, further comprising:
   an adapter unit for connecting to said wiring bus and to the electronic apparatus, said adapter unit electrically transferring signals between said wiring bus and the electronic apparatus causing normal operation of the electronic apparatus.

6. A system in accordance with claim 5, wherein:
   said normal operation of the electronic device is similar to operation of the electronic device with the hardware portion instead of the hardware emulation system;
   a data processing installation configures said multiplicity of configurable logic cells to receive and generate said signals transferred between said wiring bus and the electronic apparatus, said signals transferred between said wiring bus and the electronic apparatus are actual real time signals for operation of the electronic apparatus and said multiplicity of configurable logic cells operate on said signals in real time,
   said interrogation means reports said type of data during operation of said logic cells.

7. A hardware emulation system according to claim 1, wherein:
   said delay means in separate logic cells represent race conditions between said separate logic cells.

8. A hardware emulation system according to claim 1, wherein:
   said delay means in respective said logic cells represent propagation times of signals in said respective logic cells.

9. A hardware emulation system according to either claim 3 or claim 4, wherein:

said delay means are connected to RAMs for programming of said delay means.

10. A hardware emulation system according to claim 9, wherein:

said input unit of each of said logic cells includes multiplexer means connected to a wiring bus and for selectively connecting one of a plurality of lines of said wiring bus to said delay means, a subsequent multiplexer connected to said delay means and another input, said subsequent multiplexer selectively connecting one of said delay means and said another input to said interrogation unit of said input unit, said multiplexer, said one of said delay means said subsequent multiplexer and said another input being connected to one of said RAMs for programming.

11. A hardware emulation system according to claim 10, wherein:

said input unit of each of said logic cells has an output connected with a selectable logic function unit.

12. A hardware emulation system according to claim 11, wherein:

said logic function units includes inputs, said inputs being connectable over said input unit subsequent multiplexer to fixed logic potentials $F_n$ of said RAM.

13. A hardware emulation system according to claim 11, wherein:

said output unit of each of said logic cells comprises a multiplexer, said multiplexer of said output unit being for selectively passing one of, said output from said logic unit and said data from said multiplexer means of one of said input units, said output unit includes said interrogation means, one of said delay means and a demultiplexer for selectively connecting said delay means of said output unit to one of said plurality of lines of said wiring bus.

14. A hardware emulation system according to claim 13, wherein:

said selectable logic function means and said output unit multiplexer, said output delay unit and said output unit demultiplexer are connected to a common one of said RAMs for programming thereof.

15. A hardware emulation system according to claim 14, wherein:

a direct connection is provided between said input unit and an input of said output unit multiplexer of each of said logic cells, said direct connection allowing, by corresponding programming, said logic function unit to be bypassed.

16. A hardware emulation system according to claim 15, wherein:

each of said delay means can digitally be graded within a given range.

17. A hardware emulation system according to claim 16, wherein:

a multiplicity of said logic cells are combined to form field programmable emulation (FPE) modules by means of a wiring bus.

18. A hardware emulation system according to claim 17, wherein:

a plurality of said FPE modules are connected with each other over free-programmable coupling fields.

19. A hardware emulation system according to claim 18, wherein:

said free-programmable coupling fields are provided with delay elements.

20. A hardware emulation system according to claim 19, wherein:

each of said coupling fields includes signal lines with a delay element inserted therein.

21. A hardware emulation system according to claim 20, wherein:

said delay elements are fine-graded.

22. A hardware emulation system according to claim 20, wherein:

each delay element of signal lines of said coupling fields being connected to a RAM for programming thereof.

23. A hardware emulation system according to claim 22, wherein:

each intersection of a signal line of one of said coupling fields with another signal lines with another signal line of one of said coupling fields is programmable by means of a RA;

said interrogation means reports said type of data during operation of said logic cells.

24. A hardware emulation system, comprising:

a plurality of configurable logic cells, each of said plurality of configurable logic cells including a logic function means for performing a logic function on an input and generating an output which is a result of said logic function on said input, said logic function means being selectable a plurality of different logic functions, said each of said plurality of configurable logic cells also including a delay means for delaying one of said input and output of said logic function means inside said each of said plurality of configurable logic cells, said delay means receiving and holding said one of said input and said output for a variable time period, said time period being individually selectable for each of said delay means, said delay means delays signals of a respective logic cell to represent time behavoir of said respective said logic cell and wiring portions of a circuit which is to be emulated;

a wiring bus including a plurality of lines to form a plurality of logic modules by connecting together said plurality of configurable logic cells, and to receive external inputs from said plurality of configurable logic cells, and to apply an output of one of said plurality of configurable logic cells to an input of another of said plurality of configurable logic cells, and to provide an external output.

25. A system in accordance with claim 24, wherein:

said each of said plurality of configurable logic cells includes a plurality of input means for separately receiving one of said inputs to said plurality of configurable logic cells, said plurality of input means equalling said plurality of lines of said wiring bus, each of said plurality of input means including a first multiplexer means connected to said plurality of lines of said wiring bus and for selectively connecting said input means to one of said plurality of lines of said wiring bus, said each of said input means including input delay means for receiving data from said first multiplexer means and for delaying said data for a variable time period, said each of said input means also including a second multiplexer means for receiving said data from said input delay means and another input, said second multiplexer means selectively connecting one of said delay means and said another input to said logic function means; said each of said plurality of configurable logic cells also includes an input RAM means for controlling said each input means, said input RAM means directing said first multiplexer means to select a predetermined one of said plurality of said lines of said wiring bus, said input RAM means also connected to said input delay means for indicating to said input delay means a length of said variable time period, said input RAM means also connected to said another input of said second multiplexer means for passing a predetermined data signal to said second multiplexer means, said input RAM means also for directing said second multiplexer means to connect one of said another input and said input delay means to said logic function means; said each of said input means also including input interrogation means for reporting a type of data input to said logic function means from said each input means, said each of said plurality of configurable logic cells also including output means for connecting an output of said logic means to said wiring bus, said output means including output multiplexer means for selectively passing one of said output from said logic function means and said data from said first multiplexer of one of said input means, said output means including output delay means for receiving data from said second multiplexer means and for delaying said data for a variable time period, said output means also including demultiplexer means for selectively connecting said output delay means to one of said plurality of lines of said wiring bus; said each of said plurality of configurable logic cells also including output RAM means connected to said output multiplexer for selecting one of said plurality of different logic functions, said output RAM means also connected to and for directing said output multiplexer means to connect one of said output from said logic function means and said data from said first multiplexer of said one of said input means to said output input delay means, said output RAM means connected to said output delay means for indicating to said output delay means a length of said variable time period, said output RAM means connected to said demultiplexer for indicating which of said plurality of lines is to be connected to said output delay means; said each of said plurality of configurable logic cells also including output interrogation means for reporting a type of data output from said logic function means.

26. A hardware emulation system, comprising:

a wiring bus containing a plurality of lines;

a multiplicity of configurable logic cells, said logic cells being connected with each other through said wiring bus to form logic blocks of configurable input/output cells and a configurable wiring arrangement, each of said multiplicity of configurable logic cells including an output unit, and each output unit including a programmable delay means for individually delaying an output of said output unit for a programmable amount of time, whereby said delay means delays an output signal of said output unit to represent time behavior of a respective said logic cell and wiring portions of the apparatus which is emulated, an interrogation means in each output unit for reporting a type of data in said logic cell and a demultiplexer means connected to said delay means and said wiring bus for selectively placing said output of said output unit onto any one of said plurality of lines of said wiring bus, each of said logic cells including a plurality of inputs, each said input being selectively connectable to any one of said plurality of lines of said wiring bus.

* * * * *